United States Patent [19]

Laridon et al.

[11] 4,062,682

[45] Dec. 13, 1977

[54] FIXER COMPOSITIONS USED IN PLANOGRAPHIC PRINTING CONTAINING ONIUM COMPOUNDS

[75] Inventors: Urbain Leopold Laridon, Wilrijk; René Aloïs Van Brandt, Kessel; Albert Lucien Poot, Kontich, all of Belgium

[73] Assignee: AGFA-GEVAERT N.V., Mortsel, Belgium

[21] Appl. No.: 600,121

[22] Filed: July 29, 1975

[30] Foreign Application Priority Data

Nov. 12, 1974 United Kingdom ............... 48944/74

[51] Int. Cl.$^2$ .......................... G03C 5/54; G03F 7/02; B41M 5/00; B41N 3/00
[52] U.S. Cl. ........................................ 96/29 L; 96/33; 101/466
[58] Field of Search ................... 96/29 L, 33; 101/466

[56] References Cited

U.S. PATENT DOCUMENTS

| | | | |
|---|---|---|---|
| 3,186,842 | 6/1965 | DeHaas et al. | 96/29 L |
| 3,260,198 | 7/1966 | Wagemans et al. | 96/29 L |
| 3,490,906 | 1/1970 | Blake | 96/29 L |
| 3,615,508 | 10/1971 | Stephan et al. | 96/60 BF |
| 3,676,125 | 7/1972 | DeHaas | 96/29 L |
| 3,721,559 | 3/1973 | DeHaas et al. | 96/29 L |
| 3,819,374 | 6/1974 | Kemp | 96/29 L |
| 3,832,175 | 8/1974 | Kemp | 96/29 L |
| 3,904,412 | 9/1975 | Serrien et al. | 96/29 L |

*Primary Examiner*—David Klein
*Assistant Examiner*—Richard L. Schilling
*Attorney, Agent, or Firm*—William J. Daniel

[57] ABSTRACT

A method for the preparation of a planographic printing plate wherein a sheet material comprising an outer hardenable hydrophilic colloid layer on whose surface is concentrated a visible silver image that has been formed thereon from silver halide complexes according to the silver complex diffusion transfer process, is treated with an aqueous lithographic fixer having a pH in the range of 1.0 to 6.5 and containing 1. an iron(III) salt of a polyaminopolycarboxylic acid as oxidizing agent for the silver image,
2. a compound yielding in dissolved state iodide ions as precipitating agent for silver ions, and
3. an organic onium compound.

11 Claims, No Drawings

FIXER COMPOSITIONS USED IN PLANOGRAPHIC PRINTING CONTAINING ONIUM COMPOUNDS

The present invention relates to a method for the preparation of planographic printing plates by converting silver images into hydrophobic ink-receptive images and to liquid compositions for improving the ink-receptivity of the silver images.

It is known to produce planographic printing plates of improved quality by the use of a sheet material comprising an outer hydrophilic colloid layer, on the surface of which there is concentrated a silver image that has been formed on this surface from complexed silver halide by a silver complex diffusion transfer process.

According to the method for the preparation of planographic printing plates described in the United Kingdom Pat. No. 1,241,661 filed June 18, 1967 by the Applicant the thus prepared silver image is rendered hydrophobic with an aqueous liquid, called "lithographic fixer", which liquid has a pH-value between 7 and 12 and contains (1) hexacyanoferrate(III) ions, by means of which said silver image is oxidized at least superficially, and (2) an organic compound that at least in part is dissolved in said liquid and reacts with said oxidized silver to render said image hydrophobic.

Although the lithographic fixer described in the above-mentioned Patent has particularly favourable hydrophobizing properties some disadvantages are associated therewith.

A disadvantage associated with the use of a lithographic fixer containing cyanoferrate(III) ions is that these ions should be kept carefully out of contact of acids, for acids set free toxic hydrogen cyanide, e.g. in the drain.

It is an object of the present invention to provide a method for the preparation of a planographic printing plate with less pollution risk by using a new lithographic fixer solution.

It is another object of the present invention to transform a material on which a silver image has been formed according to the silver halide complex diffusion transfer process into a long lasting planographic printing plate.

It has now been found that said objects can be accomplished by treating a material having an outer hardenable hydrophilic colloid layer on whose surface is concentrated a visible silver image that has been formed thereon from silver halide complexes according to the silver halide complex diffusion transfer process, with an aqueous acid lithographic fixer having a pH in the range of 1.0 to 6.5 and containing 1. an iron(III) salt of a polyaminopolycarboxylic acid as oxidizing agent for the silver image,
2. a compound yielding in dissolved state iodide ions as precipitating agent for silver ions e.g. an alkaline metal or ammonium iodide, and
3. an organic cationic compound, which liquid imparts a stronger ink-receptivity to the silver image areas for a lithographic ink as defined hereinafter than the same liquid without ingredient (3), the type and concentration of said organic cationic compound in said liquid being such that said liquid is capable of making a silver image, which is obtained through said silver halide complex diffusion transfer process on an image-receiving layer as described hereinafter, by treating it for 8 s at 22° C sufficiently ink-receptive for said lithographic ink to form on a lithographic press in printing position with said lithographic ink an ink deposit on paper used in lithographic printing of an optical density at least 0.5 higher than obtained with the same liquid being free from ingredient (3); the image-receiving layer being coated at 20 g per sq.m from:

| | |
|---|---|
| water | 890 ml |
| 12.5 % by weight aqueous solution of saponin | 10 ml |
| aqueous dispersion of colloidal nickel sulphide comprising 0.2 g of nickel sulphide and 10 g of gelatin | 100 ml | onto a supported gelatino-silver chlorobromide (1.5 mole % Br) emulsion layer having a silver halide content equivalent with 1 g of silver nitrate per sq.m and wherein the ratio by weight of gelatin to silver halide (expressed as silver nitrate) is 10 to 3; and said lithographic ink having the following composition:

| | parts by weight |
|---|---|
| Lake Red C (C.I. 15,585) | 80 |
| styrenated linseed-tung oil alkyd of 60 percent oil length and 10 percent styrene content | 100 |
| aliphatic petroleum having a boiling range of 260–290° C | 50 |
| lead naphthenate | 1 |
| cobalt naphthenate | 0.12 |

The pH of said lithographic fixer is preferably in the range of 2 to 4.

The iron(III) salt in said fixer is preferably an iron(III) salt of a polyaminopolycarboxylic acid e.g. ethylenediamine tetraacetic acid (EDTA) in which one carboxyl anion stands in relation with a cation other than iron, e.g. an ammonium or an alkali metal ion.

A preferred oxidizing agent in said fixer solution is the iron(III) ammonium salt of ethylenediamine tetraacetic acid. Its solubility in acid aqueous medium can be improved by adding an organic water-miscible solvent, which itself is a good solvent for the salt e.g. ethylene glycol monomethyl ether. The solubility in acid aqueous medium can, however, also be increased by substituting an hydroxyalkyl group for one of the acetic acid groups as described, e.g., by J. Willems, Belg.Chem.Ind. XXIII No. 10 (1958) 1105–1116.

Said lithographic fixer contains said iron(III) salt in an amount equivalent with preferably from about 0.8 g to about 20 g of iron(III) ions per liter.

Said lithographic fixer has preferably an iodide ion content from about 0.03 mole to about 0.1 mole per liter. The iodide is preferably incorporated into the treating liquid as alkaline metal iodide e.g. in the form of potassium iodide.

A class of organic cationic compounds representing a great number of compounds suited for use in the fixer according to the invention is the class of the organic onium compounds. Preference is given to organic ammonium, organic sulphonium, and organic oxonium compounds.

The class of organic cationic compounds carrying on the positive heteroatom, e.g.

a free hydrogen atom comprises a much smaller amount of compounds that are appropriate for the purpose of the present invention.

Suited organic onium compounds are within the scope of one of the following general formulae:

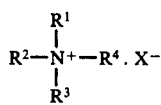 (1)

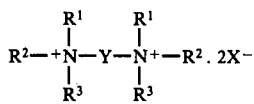 (2)

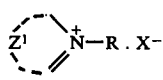 (3)

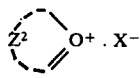 (4)

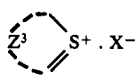 (5)

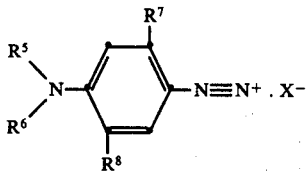 (6)

wherein:
each of $R^1$, $R^2$, $R^3$ and $R^4$ (same or different) represents an aliphatic group including a substituted aliphatic and cycloaliphatic group, said groups having not more than 5 carbon atoms in straight line, e.g. a $C_1$-$C_5$ lower alkyl group, a substituted lower alkyl group e.g. a halogen-substituted lower alkyl group, an aryl-substituted lower alkyl group e.g. a phenylmethyl group, a naphthylmethyl group or a halogenophenylmethyl group, or $R^1$ and $R^2$ together represent the necessary methylene groups or such groups interrupted by oxygen or —NH— to close a 5- or 6-membered nitrogen-containing heterocyclic nucleus, e.g. a pyrrolidine, piperidine, morpholine, or piperazine nucleus, Y represents an organic bivalent group containing at maximum 10 carbon atoms in straight line, $Z^1$ represents the necessary atoms to close a 5- or 6-membered nitrogen-containing heterocyclic nucleus, e.g. a thiazolium, benzothiazolium, indoleninium, benzimidazolium, tetrazolium, quinoxalinium, pyridinium or quinolinium nucleus including these nuclei in substituted form, R represents an aliphatic group including a substituted aliphatic and a cycloaliphatic group, said groups having not more than 8 carbon atoms in straight line e.g. a $C_1$-$C_8$ lower alkyl group, a substituted lower alkyl group e.g. a hydroxyethyl group, a sulphopropyl group or an aryl-substituted lower alkyl group e.g. a phenylmethyl (i.e. benzyl) or naphthylmethyl group wherein the aromatic nucleus is optionally halogen-substituted, $Z^2$ represents the necessary atoms to close a pyrylium nucleus including said nucleus in substituted form and in condensed form with an aromatic nucleus e.g. a benzopyrylium nucleus, $Z^3$ represents the necessary atoms to close a thiapyrylium nucleus including said nucleus in substituted form and in condensed form with an aromatic nucleus, each of $R^5$ and $R^6$ (same or different) represents hydrogen or a $C_1$-$C_2$ alkyl group, each of $R^7$ and $R^8$ (same or different) represents hydrogen or a $C_1$-$C_4$ alkoxy group, $X^-$ represent one or more anions in a number equivalent to that of the onium groups in the onium compounds, but $X^-$ is missing when the anion is already contained in the R substituent (betaine salt form).

Suitable substituents of the heterocyclic nuclei of the onium compounds according to the general formula (3) are, e.g., methyl, ethyl, alkoxy e.g. methoxy, hydroxy, cyano, sulphamoyl, sulphopropyl, cyclohexyl, phenyl, and tolyl.

Particularly useful are benzothiazolium compounds that are capable of forming a complex compound with re-halogenated silver.

The onium ions of the organic onium compound are preferably present in the lithographic fixer liquid in an amount inferior to that of the iodide ions, e.g. in a ratio of about 1:2 in respect to the iodide ions. The content of organic onium compound in the fixer liquid is preferably from about 0.01 mole per liter to about 0.1 mole per liter but may be larger or smaller depending on the type of onium compound or mixture of onium compounds used. A benzothiazolium compound of the following list is present, e.g., in the aqueous lithographic fixer in an amount of about 0.5 to about 3 equivalents with respect to the above-mentioned iodide.

When thiapyrylium compounds are used a suitable amount or water-miscible solvent (e.g. dimethylformamide) should be added to dissolve them in aqueous medium.

In the folllowing table a list of organic onium compounds that are particularly suited for the purpose of the present invention is given.

Table

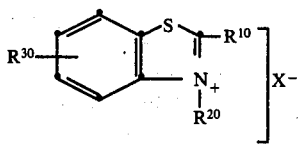

| No. of the compound | $R^{10}$ | $R^{20}$ | $R^{30}$ | X | Melting point °C |
|---|---|---|---|---|---|
| 1 | $CH_3$ | $C_2H_5$ | H | I | 188 |

Table-continued

| | | | | | |
|---|---|---|---|---|---|
| 2 | CH₃ | CH₃ | H | CH₃SO₄ | 140 |
| 3 | CH₃ | CH₂CH₂OH | 5,6-diCH₃ | Br | 242 |
| 4 | CH₃ | C₂H₅ | 5,6-diCH₃O | C₂H₅SO₄ | 152 |
| 5 | CH₃ | C₂H₅ | 5-CH₃ | C₂H₅SO₄ | 132 |
| 6 | CH₃ | CH₃ | H | p-tolSO₃ | 190 |
| 7 | CH₃ | C₂H₅ | 5,6-diCH₃O | I | 230 |
| 8 | NH₂ | CH₃ | H | I | 250 |

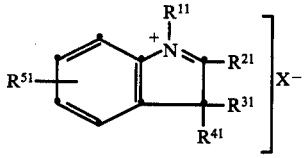

| No. of the compound | $R^{11}$ | $R^{21}$ | $R^{31}$ | $R^{41}$ | $R^{51}$ | X | Melting point °C |
|---|---|---|---|---|---|---|---|
| 9 | CH₃ | CH₃ | CH₃ | CH₃ | H | I | 250 |
| 10 | CH₂CH₂OH | CH₃ | CH₃ | CH₃ | H | Br | 194 |
| 11 | CH₃ | CH₃ | CH₃ | CH₃ | 5-OH | I | 260 |
| 12 | CH₃ | CH₃ | CH₃ | CH₃ | 5-SO₂NH₂ | I | 264 |
| 13 | H | CH₃ | CH₃ | CH₃ | H | I | not isolated (used after preparation) |

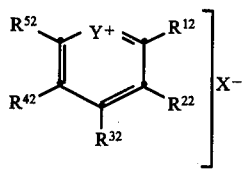

| No. of the compound | $R^{12}$ | $R^{22}$ | $R^{32}$ | $R^{42}$ | $R^{52}$ | Y | X | Melting point °C |
|---|---|---|---|---|---|---|---|---|
| 14 | —N⌒H⌒O (morpholino) | phenyl | H | H | phenyl | S | ClO₄ | 196 |
| 15 | —N⌒H⌒ (piperidino) | phenyl | H | H | phenyl | S | ClO₄ | 160 |
| 16 | —N⌒H⌒ (piperidino) | phenyl | H | H | phenyl-CH₃ | S | ClO₄ | 194 |
| 17 | CH₃ | H | CH₃ | —CH=CH—CH=CH— | | O | Cl | 190 |

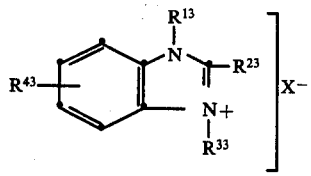

| No. of the compound | $R^{13}$ | $R^{23}$ | $R^{33}$ | $R^{43}$ | X | Melting point °C |
|---|---|---|---|---|---|---|
| 18 | C₂H₅ | CH₃ | (CH₂)₄SO₃⁻ | 5-CN | — | over 260 |
| 19 | C₂H₅ | CH₃ | CH₂CH₂OH | 5-CN | Br | over 260 |

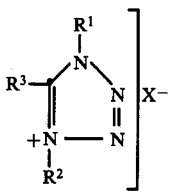

| No. of the compound | $R^1$ | $R^2$ | $R^3$ | X | Melting point °C |
|---|---|---|---|---|---|
| 20 | phenyl | CH₃ | CH₃ | I | over 260 |

Table-continued

| No. | R | R' | R'' | X | M.p. |
|---|---|---|---|---|---|
| 21 | 2-methylphenyl | C₂H₅ | CH₃ | I | 163 |
| 22 | phenyl | | CH₃ | CH₃ | I | 230 |

Pyridinium salt structure:
[pyridine-N⁺—R] X⁻

| No. of the compound | R | X | Melting point °C |
|---|---|---|---|
| 23 | benzyl (PhCH₂) | Cl | hygroscopic |
| 24 | benzyl (PhCH₂) | Br | 94 |
| 25 | benzyl (PhCH₂) | p-tolSO₃ | 120 |

Quinolinium salt structure with $R^1$, $R^2$ and X⁻

| No. of the compound | $R^1$ | $R^2$ | X | Melting point °C |
|---|---|---|---|---|
| 26 | C₂H₅ | CH₃ | I | 226 |
| 27 | CH₃ | H | CH₃SO₄ | 102 |
| 28 | CH₃ | CH₃ | I | 195 |

Bis-ammonium structure:
$$[R^2-N^+(R^1)(R^3)-(CH_2)_n-N^+(R^1)(R^3)-R^2]\,2X^-$$

| No. of the compound | $R^1$ | $R^2$ | $R^3$ | n | X | Melting point °C |
|---|---|---|---|---|---|---|
| 29 | CH₃ | CH₃ | CH₃ | 5 | Br | over 260 |
| 30 | CH₃ | CH₃ | CH₃ | 6 | Cl | over 260 |

Diazonium structure:
$[R^1R^2N\text{-}C_6H_4\text{-}N_2^+]_n \; ZnCl_{2+n}$

| No. of the compound | $R^1$ | $R^2$ | n | Melting point °C |
|---|---|---|---|---|
| 31 | CH₃ | CH₃ | 2 | dec. > 100 |

| No. of the compound | Formula | Melting point °C |
|---|---|---|
| 32 | 1-ethylquinoxalinium iodide (I⁻) | 146 |

Table-continued

| 33 | 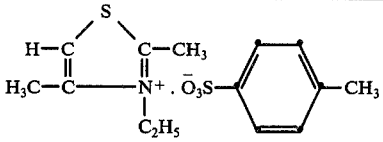 | 86 |

The compounds listed in the Table I can be prepared as follows. Sometimes the references of the preparation are given.

Preparation of Compound 1

1 Mole of 2-methyl-benzothiazole and 1.25 mole of ethyl iodide were heated in an autoclave at 100° C for 24 h. The product was washed with acetone. Melting point: 188° C.

Preparation of Compound 2

0.9 Mole of dimethyl sulphate were added dropwise to 1 mole of 2-methyl-benzothiazole dissolved in 150 ml of dry boiling toluene. The mixture was refluxed for 45 min. After cooling, the precipitate was isolated, washed with acetone, and recrystallized from ethanol. Melting point: 140° C.

Preparation of Compound 3

A mixture of 0.6 mole of 2,5,6-trimethyl-benzothiazole and 0.72 mole of 2-bromoethanol was heated at 130° C for 6 h. The crystalline mass was boiled with 100 ml of acetone, filtered, and washed with 100 ml of acetone and 100 ml of ether. Melting point: 242° C.

Preparation of Compound 4

A mixture of 0.1 mole of 2-methyl-5,6-dimethoxy-benzothiazole and 0.09 mole of diethyl sulphate in 100 ml ethanol was refluxed for 8 h. The solvent was evaporated and the residue was washed with acetone and recrystallized from ethanol. Melting point: 152° C.

Preparation of Compound 5

A mixture of 0.2 mole of 2,5-dimethylbenzothiazole and 0.24 mole of diethyl sulphate in 40 ml of dry toluene were kept at 100° C for 6 h. After cooling, the crystals were filtered and washed with dry ether. Melting point: 132° C.

Preparation of Compound 6

149 g (1 mole) of 2-methyl-benzothiazole and 223.2 g (1.2 mole) of p-toluenesulphonic acid methyl ester were dissolved in 1.5 l of toluene and heated at 130° C for 24 h under nitrogen atmosphere. After cooling, the precipitate was filtered off and washed with acetone. Melting point: 190° C. Yield: 84% (280 g).

Preparation of Compound 7

Step 1: 2,2'-dinitro-4,5-4',5'-tetramethoxy-diphenyl disulphide (compound I)

1,2-Dimethoxy-4,5-dinitro-benzene (compound II) was prepared as described by Drake et al., J.Amer.-Chem.Soc. 68 (1946) 1541.

A mixture of 500 ml of methanol, 326 g (1.2 mole) of sodium sulphide-9-water and 44 g (1.16 mole) of sulphur was refluxed for 1 h. This gave solution A.

Solution A was added in a period of 1 h to a refluxing solution of 620 g (2.72 moles) of compound II in 3.5 l of methanol. The mixture was refluxed for another 1½ h. After cooling, the precipitate was filtered and washed with methanol and hot water. The product was dried at 70° C. Melting point: 228° C. Yield: 83% (485 g).

Step 2: 2-methyl-5,6-dimethoxy-benzothiazole (compound III)

A suspension of 965 g (2.25 moles) of compound I in acetic anhydride was put in an autoclave and mixed with 7.5 g of rhenium heptasulphide and another 500 ml of acetic anhydride. Hydrogen was introduced up to a pressure of 1500 psi whereupon the autoclave was slowly heated to 120° C with shaking. The temperature was raised to 150° C. After 5 h, the absorption of hydrogen ceased. The mixture was filtered, the filtrate was concentrated at normal pressure until the residue reached a temperature of 150° C. The remaining anhydride was removed in vacuo. The crude product was distilled. Boiling point: 158°–164° C/2 mm Hg. Melting point: 70° C. Yield: 83% (781 g).

Step 3: Compound 7

A solution of 104.5 g (0.5 mole) of compound III and 78 g (0.5 mole) of ethyl iodide in 200 ml of nitromethane was refluxed for 24 h while stirring. After cooling, the precipitate was filtered, washed with dry ether and crystallized from methanol. Melting point: 230° C. Yield: 76% (139 g).

Preparation of Compound 8

150 g (1 mole) of 2-aminobenzothiazole and 63 ml of methyl iodide in 400 ml of acetone were refluxed for 4 h on a waterbath. The reaction mixture was cooled overnight in a refrigerator. The obtained crystals were filtered, first washed with acetone and then with ether, and dried under reduced pressure. Melting point: 250° C.

Preparation of Compound 9

1 Mole of 2,3,3-trimethyl-indolenine and 1.3 mole of methyl iodide in 200 ml of acetone were refluxed for 4 h. After cooling, the crystals were filtered and purified by vapour extraction with ethanol. Melting point: 250° C.

Preparation of Compound 10

1 mole of 2,3,3-trimethyl-indolenine and 1 mole of 2-bromoethanol in 1000 ml of n-butanol were refluxed for 15 h. The cooled mixture was poured in 6 l of ether. The crystals were filtered and recrystallized from ethanol. Melting point: 194° C.

Preparation of Compound 11

Step 1: 2,3,3-trimethyl-5-methoxy-indolenine (compound I)

A mixture of 0.18 mole of 4-methoxy-phenylhydrazine, 0.27 mole of methyl isopropylketone, 5 drops of acetic acid and 300 ml of ethanol was refluxed for 3 h, whereupon the solvent was evaporated. The dark residue (28 g of hydrazone) was dissolved in 125 ml of ethanol. After adding 54 ml of a 15% by weight solution of concentrated sulphuric acid in ethanol the mixture was refluxed for 2.5 h. The white precipitate (ammonium sulphate) was filtered and the filtrate was diluted with 750 ml of water, neutralized with a few ml of aqueous 5N sodium hydroxide and extracted with ether. The dried extract was distilled in vacuo. Boiling point: 138°–142° C/8 mm Hg.

Step 2: 2,3,3-trimethyl-5-hydroxy-indolenine (compound II)

0.1 Mole of compound I was dissolved in a mixture of 80 ml of acetic acid and 80 ml of aqueous hydrobromic acid (48% by weight), refluxed for 8 h and then diluted with 250 ml of water. The solution was neutralized with 115 ml of ammonia (23% by weight). The precipitate was isolated, washed with water, and dried. Melting point: 185° C.

Step 3: Compound 11

0.1 Mole of compound II and 0.2 mole of methyl iodide in 200 ml of methanol were refluxed for 15 h. The cooled solution was diluted with 1 l of ether, whereupon the precipitate was filtered and crystallized from ethanol. Melting point: 260° C.

Preparation of Compound 12

Step 1:

2,3,3-trimethyl-5-sulphonamido-indolenine (compound I) was prepared by condensing 0.25 mole of p-sulphonamidohydrazobenzene with 0.4 mole of methyl isopropyl ketone in 550 ml of methyl glycol and 1 ml of acetic acid by boiling for 1 h. After evaporation of the solvent, the hydrazone (20 g) was stirred with 70 ml of 70% by weight sulphuric acid at 100° C for 3.5 h.

The dark red solution was cooled and alkalized with potassium hydroxide. The brown precipitate was filtered and crystallized from ethanol over charcoal. Melting point: 231° C.

Step 2:

0.2 Mole of compound I and 0.24 mole of methyl iodide in 1 l of methanol were refluxed for 15 h, cooled, and diluted with 3 l of ether. The precipitate was crystallized from methanol over charcoal. Melting point: 264° C.

Preparation of Compound 13

2,3,3-Trimethyl-indolenine was dissolved in water containing an equivalent amount of hydroiodic acid. The obtained reaction product was not isolated and used as such in the aqueous medium.

Compound 14 was prepared according to the general preparation method described in J.Prakt.Chem. 313 (6) (1971) 1113–7.

In this method 0.05 mole of a β-chlorovinyl-methine-immonium perchlorate, having the general formula:

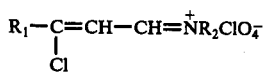

(wherein for compound 14 $R_1$=phenyl, and $NR_2$=morpholino) and 0.05 mole of a N,N-disubstituted thioacetamid derivative having the general formula:

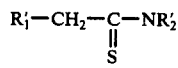

(wherein $R_1'$=phenyl, and $NR_2'$=morpholino for compound 14) are dissolved in about 100 ml of acetic anhydride and after the addition of 1 ml of triethylamine refluxed for 15 min. After cooling ether is carefully added to the reaction mixture in order to precipitate the reaction product. The crude reaction product is separated by suction and purified by recrystallization from a mixture of ethanol/acetic acid.

Compounds 15 and 16 were prepared analogously to compound 14, by reacting the piperidino analogue of the above immonium perchlorate, in the first case, and the methyl phenyl homologue of that perchlorate in the second case with the same thioacetamid derivative.

Compound 17 was prepared according to the general method described in Zh.Nauch.Prikl.Fotogr. Kinematogr. 9 (1964) 209–10.

The synthesis was carried out by condensation of pyrogallol with the corresponding β-diketone (which for compound 17 is acetylacetone) by introducing hydrogen chloride in the acetic acid solution of these compounds. The structure of the obtained product was verified by elemental analysis taking chlorine as the guide element. The products obtained are yellow to orange powders which are easily soluble in alcohol and aqueous alkalisulphite but difficult to dissolve in water.

Preparation of Compound 18

Step 1:

3-nitro-4-chloro-benzoyl chloride (compound I) was prepared by refluxing for 4 h a cautiously prepared mixture of 113 g (0.56 mole) of 3-nitro-benzoic acid and 115 ml (1.58 mole) of thionyl chloride. The surplus thionyl chloride was then removed in vacuo and the residue crystallized from n-hexane. Melting point: 50° C. Yield: 90% (109 g).

Step 2: 3-nitro-4-chloro-benzamide (compound II)

A solution of 220 g (1 mole) of compound I in 210 ml of acetone was added dropwise with stirring to 500 ml of 25% by weight aqueous ammonia. The temperature was kept below 30° C by an ice/salt mixture. After the addition of 700 ml of water, the precipitate was filtered, dried at 80° C, and crystallized from 1 l of methanol. Melting point: 153° C. Yield: 85% (172 g).

Step 3: 3-nitro-4-(N-ethylamino)-benzamide (compound III)

160 g (0.8 mole) of compound II were added portionwise with stirring at 60° C to 720 g of 50% by weight aqueous ethylamine. The mixture was cooled, whereupon the precipitate was collected and crystallized from the monomethyl ether of ethylene glycol (5 ml per g of dried product). Melting point: 226° C. Yield: 88% (147 g).

Step 4: 1-ethyl-2-methyl-5-carbamyl-benzimidazole (compound IV)

A mixture of 125 g (0.6 mole) of compound III, 214 g (2.1 moles) of acetic anhydride, 1.2 ml of Raney nickel and 36 g (0.6 mole) of acetic acid was hydrogenated at 80° C and a pressure of 100 to 30 kg/sq.cm for 5 h. After cooling, the catalyst was filtered, and the filtrate was concentrated by normal pressure until 135 ml of distillate were collected. Then 150 ml of 6N sulphuric acid were added to the residue. The reaction was very exothermic. The solution was refluxed with active carbon for 15 min and filtered. The filtrate was mixed with 1.2 kg of ice and exactly neutralized with 2N sodium hydroxide. The precipitate was washed with water and dried at 100° C. Melting point: 251° C. Yield: 88% (108 g).

Step 5: 1-ethyl-2-methyl-5-cyano-benzimidazole (compound V)

42.4 ml (0.44 mole) of phosphorus oxychloride were added to a stirred and ice-cooled solution of 81.2 g (0.4 mole) of compound IV in 160 ml of pyridine. The temperature reached 45° C. Thereupon the mixture was heated to 60° C. The reddish-brown oil obtained was poored immediately in 1 kg of an ice-water mixture with stirring. The precipitate was filtered, washed with ice-cold water and dried. The crude product obtained was crystallized from pyridine (1.5 ml/g) and water (9 mg/g). Melting point: 162° C. Yield: 61% (452 g).

Step 6: 1-ethyl-2-methyl-3-(4'-sulphobutyl)-5-cyano-benzimidazole 18.6 g (0.1 mole) of compound V and an equimolar amount of 1,4-butanesultone were heated at 140° C for 4 h, then washed with acetone and dried. Melting point: over 260° C. Yield: 72% (23 g).

Preparation of Compound 19

18.5 g. of 1-ethyl-2-methyl-5-cyanobenzimidazole (step 5, compound 18) and 12.5 g (0.1 mole) of 2-bromoethanol were heated for 4 h at 110° C, washed with acetone and dried. Melting point: over 260° C. Yield: 72% (29 g).

Preparation of Compound 20

1-cyclohexyl-5-methyl-tetrazole was prepared as described in J.Org.Chem. 15 (1950) 668.

A mixture of 8.3 g (0.05 mole) of this compound and 7.81 g (3.5 moles) of methyl iodide were heated in a sealed tube for 24 h at 110° C. The crude product obtained was washed with acetone and dried. Melting point: over 260° C. Yield: 93% (14.3 g).

Preparation of Compound 21

Step 1: 1-(o-tolyl)-5-methyl-tetrazole (I)

53.5 g (0.5 mole) of o-toluidine, 140 ml of 35% by weight hydrochloric acid and 200 g of ice were mixed, diazotized with 34.5 g of sodium nitrite, neutralized with 5N sodium hydroxide to pH 6 and filtered. This gave solution A.

58 g (0.5 mole) of 1,2-diacetylhydrazine and 26.5 g of sodium carbonate were dissolved in 500 ml of water and cooled to 0° C. Solution A was added dropwise with stirring at 0° C. A yellow tacky precipitate was formed. Then 1 l of 5N sodium hydroxide was added at 0° C. The precipitate became a dark oil.

After 24 h at room temperature, the aqueous layer was separated from the oily precipitate, which solidified when washed with ether. Melting point: 84° C. Yield: 10% (8.5 g).

Step 2: Compound 21

7.5 g (0.043 mole) of compound I and 4.2 ml of ethyl iodide were heated at 150° C in a sealed tube for 24 h, then washed with ether and dried. Melting point: 163° C. Yield: 85% (12 g).

Preparation of Compound 22

1-Phenyl-5-methyl-tetrazole was prepared as described in Ber. 43 (1910) 2904.

16 g (0.1 mole) of this product and 7 ml of methyl iodide were heated at 110° C in a sealed tube for 24 h. The crude product obtained was washed with acetone and dried. Melting point: 230° C. Yield: 90% (28 g).

Preparation of Compound 23

126.5 g (1 mole) of benzyl chloride was dissolved in 250 ml of pyridine and heated at 85°-90° C for 2 h. The mixture solidified on cooling and was washed with acetone. Yield: 87% (180 g). The product is very hygroscopic and water should be rigorously excluded during the preparation.

Preparation of Compound 24

To a stirred, refluxing solution of 80 ml (1 mole) of pyridine in 250 ml of acetone, 130 ml (1.1 mole) of benzyl bromide were added dropwise. After the addition the mixture was refluxed for 2 h and cooled, whereupon the precipitate was collected and washed with acetone. Melting point: 94° C. Yield: 90% (225 g). The product is hygroscopic.

Preparation of Compound 25

A mixture of 300 g (1.15 mole) of p-toluenesulphonic acid benzyl ester, 90 g (1.15 mole) of pyridine and 500 ml of acetone was refluxed for 8 h, filtered, cooled, and diluted with 1 l of ether. The precipitate formed was isolated and crystallized from 4 l of acetone. Melting point: 120° C. Yield: 57% (224 g).

Preparation of Compound 26

Described by W. Spaltenholz, Ber. 16 (1883) 1851; prepared analogously to compound 28 below, using ethyl iodide, crystallizes as straw-yellow needles, soluble in water with appreciable difficulty and decomposes at 226° C.

Preparation of Compound 27

By the general method described by J. Willems and J. Nys, Bull.Soc.Chim. Belges 66 (1957) 502–11. In this general method a solution of the corresponding base, (which for compound 27 is quinoline) in acetone or benzene (specifically acetone for compound 27) is allowed to reflux over a 4 to 5 hour period in the presence of the appropriate alkylating agent (which for compound 27 is dimethylsulfate). After cooling, the crystalline material is separated by suction-filtration, washed with a small amount of anhydrous ether, dried and recrystallized from an appropriate solvent (specifically ethanol-acetone). Melting point = 102° C.

Preparation of Compound 28

As described by O. Doebner & W. V. Miller, Ber. 16 (1883) 2468, by thoroughly heating together 1 mol quinaldine and 1 mol methyl iodine on a water bath. The product is slightly soluble in cold water, insoluble in ether and crystallizes by cooling from hot ethanol into lemon-yellow needles. Melting point 195° C without decomposition.

Preparation of Compound 29

As described by F. Düvel, Ann. 410 (1915) 54–70, 18 g of pentamethylene dibromide and 45 g of a 33% by weight solution of trimethylamine in anhydrous ethanol were put together in a high-pressure reaction tube. The reaction proceeded exothermically and a fine crystalline white precipitate was formed. Thereupon the reaction mixture was heated at 80° C for 24 h while shaking. After cooling of the reaction mass the solid crystalline product was separated by suction. From the filtrate a further amount of reaction product was separated by precipitation with ether. The reaction product was recrystallized from ethanol.

Preparation of Compound 30

As described in Brit. Pat. No. 742,138, a solution of 862 g. (5 moles) of N,N,N',-N'-tetramethylhexamethylenediamine in 3750 ml. of n-propanol was warmed to about 50° C. and methyl chloride bubbled into the solution. The heat of reaction raised the solution to reflux temperature. The reaction mixture was maintained at reflux and the methyl chloride addition continued until the pH of the solution had dropped to 7 or below. The solution was cooled with stirring to crystallise the product. The hexamethonium chloride was filtered with suction and washed with cold n-propanol. The filtrate was concentrated until it started to crystallise, cooled and filtered. This second crop was recrystallised from a minimum of boiling n-propanol and then combined with the first crop. The product was dried at 90° to 95° C. under 26 inches of vacuum. The yield of colorless hexamethonium chloride was 11,615 g. melting with decomposition at 289°–291° C.

Preparation of Compound 31

According to the general method described by Schmidt and Maier, J. praktische Chemie, 132 (1932), 153–156, as referred to in Houben-Weyl, Methoden der organischen Chemie, Stickstoffverbindungen I, Teil 3 (1965) 34–5, 1 g of dimethyl-p-phenylenediamine hydrochloride was dissolved in 30 ml of water and to the obtained solution 5 ml of concentrated hydrochloric acid were added. The mixture was cooled to 0° C and thereto a cooled solution of 0.4 g of sodium nitrite in water was added. A reddish yellow 2% diazonium salt solution was obtaned. To the solution a concentrated aqueous zinc chloride solution was added whereupon the diazonium-zinc salt separated as a crystalline product. (J.prakt.Chem. (2) 132, 155 (1932)).

Preparation of Compound 32

As described by O. Hinsberg, Ann. 292 (1896) 245, equivalent amounts of quinoxaline and ethyl iodide were put together in a closed reaction flask and kept at room temperature for several days. The reaction mixture solidified forming a cake of red crystals. Recrystallization from ethanol yielded red needles melting with decomposition at 146° C.

Preparation of Compound 33

11.3 g (0.1 mole) of 2,4-dimethylthiazole were mixed with 30 g (0.15 mole) of ethyl-p-tolusulphonate and heated for 24 h at 130° C in a sealed tube.

On opening the tube after cooling an oily product was obtained which became solid by washing with ether. The product was crystallized twice from 200 cm3 of acetone upon boiling in the presence of active carbon. Melting point: 86° C.

In order to obtain a more speedy oleophilic ink acceptance on the fixer-treated material so that on the printing press, e.g. already from the first printing cycle, a dense ink image is obtained, the fixer-treated material is subjected to an after-treatment with another liquid hereinafter called "oleophility-improving aqueous liquid" having a pH in the range of 7 to 12 and containing:

1. an organic nitrogen-containing compound having a thiol group or in its tautomeric structure a thione group as represented in the following tautomeric structural parts:

and
2. a long chain (at least $C_{12}$) aliphatic compound that can form a carboxylic acid salt and which is preferably added in the form of oleic acid, and
3. optionally a salt of a polyaminopolycarboxylic acid and an alkaline metal base, ammonium hydroxide or an organic base e.g. an amino compound or an organic onium hydroxide compound.

The salt of the polyaminopolycarboxylic acid in the optionally used oleophility-improving aqueous liquid is a chelating agent for iron (III) ions. Preferably the tetrasodium salt of ethylenediamine tetraacetic acid is used in a concentration of about 0.002 mole to about 0.003 mole per liter.

The oleic acid is preferably present in said liquid in a concentration of about 30 g to about 60 g per liter together with sufficient hydroxide, e.g. sodium hydroxide, to obtain a pH between 7 and 12. The long aliphatic chain of the oleic acid together with the tautomeric organic nitrogen-sulphur compound enhance the oleophilicity of the printing form portions corresponding with the oxidized silver image.

Suitable thione-thiol organic nitrogen compounds for use in the after-treatment liquid are heterocyclic compounds. Imidazolidine-2-thiones such as 1-allyl-imidazolidine-2-thione are preferred. It is prepared as follows:

105 g of carbon disulphide are added dropwise to a solution of 69.3 g of N-allylethylenediamine in 1200 ml of ethanol at 50° C. A white precipitate forms. Subsequently, the mixture is refluxed for 20 h. During the reaction hydrogen sulphide is formed and a complete solution is obtained. The solution is concentrated by evaporation to a volume of 400 ml and then cooled. The precipitate is sucked off and dried. Melting point: 90° C. Yield: 46 g.

The thione-thiol organic nitrogen compounds are preferably added to the oleophility improving liquid in an amount of about 0.01 mole to about 0.03 mole per liter.

The preparation of a planographic printing plate by using the aqueous lithographic fixer according to the present invention may be effected with a sheet material comprising a silver image obtained by any of the silver complex diffusion transfer processes hereinafter described by way of example.

A first type of silver complex diffusion transfer process utilizes a light-sensitive silver halide emulsion material and a separate image-receiving material containing on an outer surface thereof substance(s) for promoting the deposition of silver in the said silver complex diffusion transfer process.

In an embodiment of such a process the light-sensitive material comprises a water-permeable hydrophilic colloid layer on top of the silver halide emulsion layer. Such a feature is described in the United Kingdom Pat. Nos. 869,190 filed Jan. 15, 1959 by Agfa A. G., 998,955 and 998,956 both filed Oct. 19, 1961 by Gevaert Photo-Producten N.V. Alternatively a special type of image-receiving material may be used as described in United Kingdom Pat. Nos. 1,013,344 filed Apr. 16, 1962 and 1,054,252 filed Aug. 6, 1963 both by Gevaert Photo-Producten N.V.

A second type of silver complex diffusion transfer process utilizes a single material or monosheet material. It comprises a silver halide emulsion layer and may comprise an outer hardenable hydrophilic colloid layer on top thereof. In the light-sensitive materials and/or the image-receiving material substances that are essential or useful for carrying out the diffusion transfer image formation may be incorporated, e.g. developing agents.

The incorporation of developing agents into the light-sensitive and/or image-receiving material for diffusion transfer processes has been described, e.g., in United Kingdom Pat. Nos. 1,000,115 filed Aug. 4, 1961, 1,012,476 filed Dec. 18, 1961, 1,042,477 filed June 17, 1963, 1,054,253 filed Aug. 6, 1963, 1,057,273 filed Feb. 3, 1964 and 1,093,177 filed Dec. 16, 1964 all by Gevaert Photo-Producten N.V. The processing liquid used at the development stage is a so-called activating solution, which has better keeping properties than a developer solution. The presence of developing agent(s) in the photographic light-sensitive material is also favourable to rapid processing. In that case the aqueous processing liquid is merely an aqueous alkaline solution.

The light-sensitive material may further contain preservatives for these developing agents, complexing agents, stabilizers, alkaline substances, black-toning agents, hardeners, and softening agents.

Embodiments in which hardening agents and more particularly latent hardening agents are incorporated into the light-sensitive and/or image-receiving material for such processes are described in United Kingdom Pat. No. 962,483 filed Jan. 1, 1962 by Agfa AG and German Pat. No. 1,203,604 filed Jan. 15, 1964 by Agfa AG.

When the single material is used, the development nuclei may be supplied in a liquid medium to the outer surface of the light-sensitive silver halide emulsion layer. The development nuclei depositing at the outer surface of said layer make that the diffusion transfer silver deposition thus occurs at this outer surface.

If desired, the development nuclei may be applied to the surface of the light-sensitive recording material from the alkaline processing liquid for carrying out the diffusion transfer image formation or from a separate liquid composition containing such nuclei, which constitutes a step after the exposure of the light-sensitive material and before wetting with the alkaline processing liquid for forming the diffusion transfer image.

Substances for promoting the silver deposition from the diffusing complexed silver halide are sulphides of heavy metals such as the sulphides of antimony, bismuth, cadmium, cobalt, lead, nickel, silver and zinc. Other suitable salts are the selenides, polysulphides, polyselenides, mercaptans and tin (II) halides. Heavy metals or their salts and fogged silver halides are suitable too. The complex salts of lead and zinc sulphides are active both alone and when mixed with thioacetamide, dithiobiuret, and dithiooxamide. Heavy metals, preferably silver, gold, platinum, palladium, and mercury may be used in their colloidal form.

The support of the photographic material comprising the silver halide emulsion layer may be any conventional flexible support sheet, e.g. a paper sheet or a transparent hydrophobic film support, such as a support of cellulose triacetate or of a polyester, e.g. polyethylene terephthalate.

The image sharpness of the silver pattern and, as a consequence thereof, the sharpness of the final result of printing can be improved by applying visible light-absorbing dyes, so-called antireflection dyes or pigments. These dyes or pigments may be present in the silver halide emulsion layer or in the support, but preferably in a layer between the silver halide emulsion layer and the support. If a transparent support is used, the antireflection dyes or pigments may be applied to the rear side of the material or on top of the emulsion layer dependent on the manner in which the exposure is carried out, viz. at the front side or through the support. Preferably a red or black anti-reflection dye or pigment is used. A suitable black pigment is lamp black.

Any silver halide emulsion of the negative or direct-positive type can be used depending on the nature of the original to be reproduced. Preferably emulsions of the negative type are used, which have a sensitivity suitable for use in a camera.

The exposure of the silver halide emulsion layer may be carried out according to any usual technique, e.g. by contact, by back reflection, by transmission or episcopically. In general an episcopic exposure in a camera is carried out, especially when the development nuclei are provided on top of the silver halide emulsion layer as described detailedly hereinafter.

The silver halide emulsion layer generally comprises an amount of silver halide equivalent to from 0.5 to 2.5 g of silver nitrate per sq.m and preferably amounting only to the equivalent of about 1 to 1.5 g of silver nitrate/sq.m. This means a considerable economy of silver halide with respect to the silver halide content of emulsion layers commonly used in the production of diffusion transfer prints.

If necessary a suitable subbing layer is provided for strongly adhering the hydrophilic colloid layer(s) to the support sheet. The data in this paragraph also apply to any embodiment for the production of a silver pattern substantially at the surface of a hydrophilic colloid top layer according to the silver complex diffusion transfer process. The silver pattern obtained according to the silver complex diffusion transfer process in or at the surface of the outer colloid layer may be intensified by a chemical or physico-chemical after-treatment.

The sheet materials suited for use with the fixer solution of the invention are generally of simple composition, and may comprise a suitable support such as transparent hydrophobic film support, e.g. polyethylene terephthalate support or a paper sheet, having a water-impermeable coating, e.g. polyethylene coating, and the necessary subbing layers.

The developing substances, e.g. hydroquinone and 1-phenyl-3-pyrazolidinone, may be present in the anti-reflection layer subjacent to the silver halide emulsion layer, in the emulsion layer itself, and/or in the optionally present hydrophilic colloid top layer.

According to a preferred embodiment a photographic material is used, which comprises successively a support layer (paper support or resin support), an antihalation layer, and a silver halide emulsion layer containing developing substances and development nuclei on top thereof. The rear side of the support may be coated with a colloid layer containing an opacifying agent, e.g. titanium dioxide or other substance, giving it a mat appearance.

Hardening of the emulsion layer may occur before, during or after the treatment with the lithographic fixer and must occur at least to such an extent that upon printing no substantial amount of colloid is transferred either to the rollers for applying water and ink to the printing plate or to the material to be printed. In other words hardening (i.e. insolubilizing in water and strenghtening against mechanical damage) must occur at least to such an extent that the material obtained can be used as a planographic printing plate.

Said hardening mostly occurs before the treatment with the lithographic fixer. In that case hardening may be effected by incorporating in the emulsion composition the generally known hardening agents for gelatin and similar colloids, such as formaldehyde, glyoxal, mucochloric acid and chrome alum. When, as hereinbefore described a coating composition comprising development nuclei, possibly together with a minor amount of a hydrophilic colloid to keep the development nuclei in dispersion but insufficient to form a continuous binder layer with the nuclei enclosed, is applied on top of the outer layer, which is optionally the silver halide emulsion layer, the hardeners may also be incorporated into said coating composition. Hardening of the hydrophilic colloid binder of the outer layer may also occur during the production of the silver pattern. The hardening may be effected by incorporating a latent hardener in one or more layers of the sheet material, whereby a hardener is released at the stage of the application of an alkaline processing liquid for carrying out the complex silver diffusion transfer process. These latent hardeners are active only in a well defined pH-range, mostly the pH-range of the usual developing liquids. Finally, hardening of the outer hydrophilic colloid layer may also occur after the production of the silver pattern i.e. by treatment with a hardening liquid. This liquid may be an aqueous hardening composition applied before the treatment with the lithographic fixer, the fixer composition itself, or an aqueous hardening composition applied after the treatment with said fixer. At least one compound for improving the hydrophilic properties of the non-printing areas may be applied during the preparation of the printing plate.

Thus the presence of certain hydrophilic colloid binders e.g. carboxymethylcellulose, gum arabic, sodium alginate, propylene glycol ester of alginic acid, hydroxyethylstarch, dextrine, hydroxyethylcellulose, polyvinylpyrrolidone, polystyrene sulphonic acid and polyvinyl alcohol in the outer hydrophilic colloid layer carrying on its surface the pattern of silver particles, often improves the hydrophilic ink-repellent properties of the non-printing areas of the resulting printing plate. Hygroscopic substances, e.g. sorbitol, glycerol, tri(hydroxyethyl) ether of glycerol and Turkey-red oil, and certain wetting agents, may be present as well.

The hydrophilic colloid outer layer may also comprise pigment particles homogeneously dispersed therein to prevent the so-called "scumming" (i.e. ink-acceptance that arises in the non-printing areas of the printing plate, after a certain number of copies has been printed). The usual inorganic pigments, e.g. barium sulphate, titanium dioxide, china clay and silica applied from a colloidal solution, have proved to be particularly suitable for this purpose. In general, the pigment particles are applied homogeneously in such an amount that about 5-20 g per sq.cm of the hydrophilic colloid outer layer are present. A similar anti-scumming effect may also be obtained by adding at least one of the following substances: colloidal silica, an inorganic acid e.g. o-phosphoric acid, a hygroscopic substance hereinbefore described and a suitable wetting agent, to the fountain solution used during the printing process. Suitable wetting agents include:

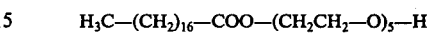

sodium dodecylsulphate
sodium tetradecylsulphate

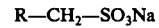

wherein R represents an alkyl group comprising from 14 to 18 carbon atoms

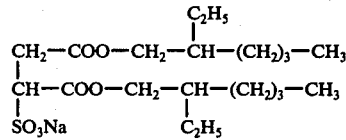

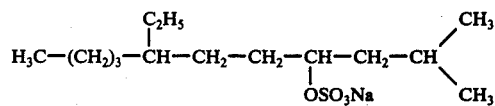

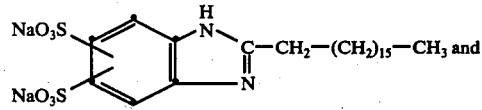

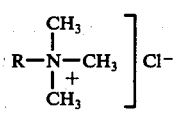

wherein

| R = | hexadecyl | 90 % by weight |
| | octadecyl | 6 % by weight |
| | octadecenyl | 4 % by weight |

The lithographic fixer of the present invention is very stable to aerial oxidation and to temperature fluctuations. Its use results in the production of planographic printing plates with non-staining image background.

When the treatment with the aqueous lithographic fixer starts, the outer colloid layer showing the silver pattern may be dry or wet. Generally the treatment with the lithographic fixer and oleophility-improving liquid does not last long, mostly no longer than about 15 s. The plate may be stored for a long time before being fixed and even thereafter it may be stored for a long time before use in the printing process. Preferably, however, the lithographic fixing step is carried out just before printing.

The lithographic fixer, the oleophility-improving liquid as well as the development or activating liquid for the production of the diffusion transfer image can be applied in different ways, e.g. by spraying, by rubbing with a roller, or by dipping the material to be treated into the liquid composition. According to a preferred embodiment, the exposed and developed plate is conducted automatically through a device having a tray filled with the lithographic fixer composition and a second tray filled with the oleophility-improving liquid. At the exit side of the second tray the plate is conveyed between two squeezing rollers removing the excess liquid. A suitable apparatus for that purpose is known under the trade-name RAPILITH RE 410 (registered trade mark of the Applicant).

Treatment of the material with a lacquer composition for strengthening the printing parts is not necessary.

The printing plate has to be wet during the stage wherein greasy printing ink is applied. This is generally known in the art and it is usual to apply an aqueous liquid before applying the printing ink. This may occur by means of a wet sponge or by means of the fountain arrangements (damping system) of the printing machine.

The following examples illustrate the use according to the present invention of a preferred lithographic fixer combination. All percentages are by weight unless otherwise stated.

EXAMPLE 1

A paper support of 90 g per sq.m carrying on both sides a polyethylene layer of 15 g per sq.m was coated on one side with an antireflection layer containing gelatin and lamp black. This layer was coated with a high-sensitive, negative silver chlorobromide (1.5 mole % of bromide) gelatin emulsion layer hardened by means of formaldehyde. The emulsion layer contained an amount of silver halide equivalent to 1 g of silver nitrate per sq.m. The dried silver halide gelatin emulsion layer was coated in a ratio of 20 g per sq.m with the following composition containing developing nuclei:

| | |
|---|---|
| water | 890 ml |
| 12.5 % aqueous solution of saponin | 10 ml |
| aqueous dispersion of colloidal nickel sulphide comprising 0.2 g of nickel sulphide and 10 g of gelatin as protective colloid | 100 ml |

The material obtained was exposed to an original and treated for 30 s in the following processing composition:

| | |
|---|---|
| sodium hydroxide | 10 g |
| anhydrous sodium sulphite | 75 g |
| potassium bromide | 1 g |
| hydroquinone | 16 g |
| 1-phenyl-3-pyrazolidinone | 1 g |
| water up to | 1000 ml |
| anhydrous sodium thiosulphate | 10 g |

The treatment to transform the developed material into a lithographic printing master was carried out in the above-mentioned RAPILITH RE 410 (trade mark) apparatus containing in its first tray a fixer solution obtained by mixing the following ingredients:

| | |
|---|---|
| demineralized water | 700 ml |
| ethyleneglycol monomethyl ether | 100 ml |
| iron(III)ammonium salt of ethylenediamine tetraacetic acid | 50 g |
| potassium iodide | 15 g |
| benzothiazolium compound 1 of the table | 20 g |
| ammonium hydroxide added in an amount to reach pH 3 and | | a sufficient amount of demineralized water to obtain 1 liter, and in its second tray an oleophility-improving aqueous liquid obtained by mixing the following ingredients:

| | |
|---|---|
| demineralized water | 550 ml |
| sodium salt of ethylenediamine tetraacetic acid | 1 g |
| sodium hydroxide | 6 g |
| oleic acid | 45 ml |
| 10 % solution of 1-allyl-imidazolidine-2-thione in ethylene glycol monomethyl ether | 52 ml |
| demineralized water up to (pH = 10) | 1 l |

The contact time of the developed material with each separate solution was 7.5 s.

More than 5000 high quality copies could be printed with the thus obtained positive planographic printing plate.

The proportions of the above solutions are suited for the transformation of a total surface area of 10 to 15 sq.m of developed silver halide materials in printing forms of almost the same high quality.

EXAMPLE 2

A polyethylene terephthalate support of 0.1 mm carrying a composite subbing layer as described in United Kingdom Pat. No. 1,234,755 filed Sept. 28, 1967 by the Applicant was coated on one side with an antireflection layer of an optical density of 0.3. This antireflection layer contained gelatin and the necessary proportion of lamp black to reach the density 0.3. The antireflection layer was covered with a high-sensitive negative silver chlorobromide gelatin emulsion layer, hardened by means of formaldehyde and comprising per sq.m 0.5 g of hydroquinone, 0.25 g of 1-phenyl-3-pyrazolidinone, and an amount of silver halide equivalent to 1 g of silver nitrate. The emulsion layer was covered with the composition containing developing nuclei of Example 1.

The light-sensitive material obtained was image-wise exposed and then dipped for 10 s in the following processing liquid:

| | |
|---|---|
| water | 1000 ml |
| sodium phosphate-12-water | 75 g |
| anhydrous sodium sulphite | 40 g |
| potassium bromide | 0.5 g |
| anhydrous sodium thiosulphate | 10 g |

In this way a positive diffusion transfer silver image was produced at the surface of the silver halide emulsion layer.

The material was then treated with the fixer solution and oleophility improving liquid of Example 1. The printing plate thus prepared yielded the same results as obtained with the plate of Example 1.

EXAMPLE 3

The positive silver image formed according to the silver halide complex diffusion transfer process as described in Example 1 was treated for 15 s with the fixer solution only.

The sole difference in the printing results of the printing master obtained was a less fast ink-acceptance for the first 10 copies of the printing run.

We claim:
1. A method for the preparation of a planographic printing plate wherein a sheet material comprising an outer hardenable hydrophilic colloid layer on whose surface is concentrated a visible silver image that has been formed thereon from silver halide complexes according to the silver complex diffusion transfer process, is treated with an aqueous lithographic fixer having a pH in the range of 1.0 to 6.5 and containing
 1. an iron (III) salt of a polyaminopolycarboxylic acid as oxidizing agent for the silver image,
 2. a compound yielding in dissolved state iodide ions as precipitating agent for silver ions, and
 3. an organic onium compound, which liquid imparts a stronger ink-receptivity to the silver image areas for a lithographic ink as defined hereinafter than the same liquid which is free from ingredient (3), the type and concentration of said organic onium compound in said liquid being such that said liquid is capable of making a silver image, which is obtained through said silver halide complex diffusion transfer process on an image-receiving layer as described hereinafter, by treating it for 8 s at 22° C sufficiently ink-receptive for said lithographic ink to form on a lithographic press in printing position with said lithographic ink an ink deposit on paper used in lithographic printing of an optical density at least 0.5 higher than obtained with the same liquid being free from ingredient (3), the image-receiving layer being coated at 20 g per sq.m from:

| | |
|---|---|
| water | 890 ml |
| 12.5 % by weight aqueous solution of saponin | 10 ml |
| aqueous dispersion of colloidal nickel sulphide comprising 0.2 g of nickel sulphide and 10 g of gelatin | 100 ml | onto a supported gelatino-silver chlorobromide (1.5 mole % Br) emulsion layer having a silver halide content equivalent with 1 g of silver nitrate per sq.m and wherein the ratio by weight of gelatin to silver halide (expressed as silver nitrate) is 10 to 3; and said lithographic ink having the following composition:

| | parts by weight |
|---|---|
| Lake Red C (C.I. 15,585) | 80 |
| styrenated linseed-tung oil alkyd of 60 percent oil length and 10 percent styrene content | 100 |
| aliphatic petroleum having a boiling range of 260–290° C | 50 |
| lead naphthenate | 1 |
| cobalt naphthenate | 0.12 |

2. A method according to claim 1, wherein the iron (III) salt in the fixer is the iron (III) ammonium salt of ethylene diamine tetraacetic acid.

3. A method according to claim 1, wherein the compound yielding iodide ions is potassium iodide.

4. A method according to claim 1, wherein the organic onium compound corresponds to one of the following general formulae:

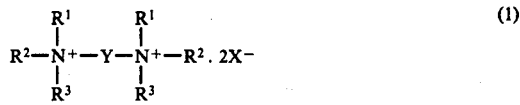

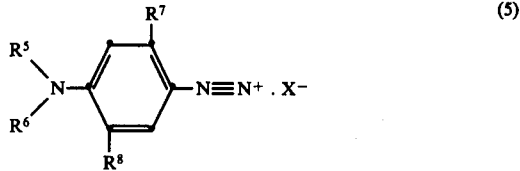

wherein:
each of $R^1$, $R^2$, and $R^3$ (same or different) represents an aliphatic group or cyclo- aliphatic group, said groups having not more than 5 carbon atoms in straight line, or $R^1$ and $R^2$ together represent the necessary methylene groups or methylene groups interrupted by oxygen or —NH— to close a 5- or 6-membered nitrogen-containing heterocyclic nucleus, Y represents an organic bivalent group containing at most 10 carbon atoms in straight line, $Z^1$ represents the necessary atoms to close a 5- or 6-membered nitrogen-containing heterocyclic nucleus, R represents an aliphatic group or a cyclo- aliphatic group, said groups having not more than 8 carbon atoms in straight line, $Z^2$ represents the necessary atoms to close a pyrylium nucleus or said nucleus in condensed form with an aromatic nucleus, $Z^3$ represents the necessary atoms to close a thiapyrylium nucleus or said nucleus in condensed form with an aromatic nucleus, each of $R^5$ and $R^6$ (same or different) represents hydrogen or a $C_1$-$C_2$ alkyl group, each of $R^7$ and $R^8$ (same or different) represents hydrogen or a $C_1$-$C_4$ alkoxy group, and $X^-$ represents one or more anions in an amount equivalent to the onium groups in the onium compounds, but $X^-$ is missing when the anion is contained already in the R substituent.

5. A method according to claim 4, wherein $Z^1$ represents the necessary atoms to close a thiazolium, benzothiazolium, indoleninium, benzimidazolium, tetrazolium, quinoxalinium, pyridinium, or quinolinium nucleus.

6. A method according to claim 5, wherein the benzothiazolium compound in the fixer is 1-methyl-3-ethylbenzothiazolium iodide.

7. A method according to claim 1, wherein the organic cationic compound (3) is an organic onium compound, which yields onium ions in the fixer in an amount inferior to that of the iodide ions present in the fixer.

8. A method according to claim 1, wherein the sheet material after the treatment with said fixer is treated with an aqueous liquid improving the oleophility of the fixer-treated silver image, said aqueous liquid having a pH in the range of 7 to 12 and containing:

1. an organic heterocyclic nitrogen-containing compound having a thiol group or a thione tautomer thereof as represented in the following tautomeric structural formula:

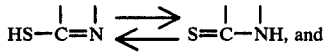

2. oleic acid.

9. A method according to claim 8, wherein the aqueous liquid improving the oleophility of the silver image also contains a salt of a polyaminopolycarboxylic acid and an alkaline metal base, ammonium hydroxide, or an organic base.

10. A method according to claim 8, wherein the organic nitrogen-containing compound is an imidazolidine-2-thione.

11. A method according to claim 1, wherein in the silver complex diffusion transfer process a single sheet material is used containing a silver halide emulsion layer, whose outer surface carries substances for promoting the deposition of silver according to the said silver complex diffusion transfer process.

* * * * *